(12) United States Patent
Chang et al.

(10) Patent No.: US 10,514,610 B2
(45) Date of Patent: Dec. 24, 2019

(54) LITHOGRAPHY PATTERNING WITH A GAS PHASE RESIST

(71) Applicant: Taiwan Semiconductor Manufacturing Co., Ltd., Hsin-Chu (TW)

(72) Inventors: Shu-Hao Chang, Taipei (TW); Kuo-Chang Kau, Miaoli County (TW); Kevin Huang, Hsinchu (TW); Jeng-Horng Chen, Hsin-Chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/030,189

(22) Filed: Jul. 9, 2018

(65) Prior Publication Data

US 2018/0314167 A1 Nov. 1, 2018

Related U.S. Application Data

(62) Division of application No. 15/061,860, filed on Mar. 4, 2016, now Pat. No. 10,018,920.

(51) Int. Cl.
*G03F 7/20* (2006.01)
*G03F 7/11* (2006.01)
(Continued)

(52) U.S. Cl.
CPC ........... *G03F 7/70341* (2013.01); *B05D 1/60* (2013.01); *B05D 3/06* (2013.01); *B05D 3/061* (2013.01); *B05D 3/068* (2013.01); *G03F 7/0042* (2013.01); *G03F 7/038* (2013.01); *G03F 7/11* (2013.01); *G03F 7/167* (2013.01); *G03F 7/201* (2013.01); *G03F 7/2004* (2013.01); *G03F 7/2037* (2013.01); *G03F 7/2039* (2013.01); *G03F 7/38* (2013.01); *G03F 7/40* (2013.01); *G03F 7/70325* (2013.01); *H01L 21/0271* (2013.01); *H01L 21/0274* (2013.01); *H01L 21/0277* (2013.01); *H01L 21/02118* (2013.01); *H01L 21/02277* (2013.01); *H01L 21/31111* (2013.01);
(Continued)

(58) Field of Classification Search
CPC ...... G03F 7/70; G03F 7/0008; G03F 7/70358; G03F 7/70933; G03F 7/70716
USPC .......................................................... 355/73
See application file for complete search history.

(56) References Cited

U.S. PATENT DOCUMENTS 4,675,270 A 6/1987 Woods et al.
5,187,048 A 2/1993 Woods et al.
(Continued)

OTHER PUBLICATIONS

Pfeiffer et al., "Physical Vapor Deposition of Molecular Glass Photoresists: A New Route to Chemically Amplified Patterning", 2007, pp. 223-2342, vol. 17, Advanced Functional Materials Journal.

*Primary Examiner* — Amanda C. Walke
(74) *Attorney, Agent, or Firm* — Haynes and Boone, LLP

(57) ABSTRACT

Disclosed is an apparatus for lithography patterning. The apparatus includes a substrate stage configured to hold a substrate coated with a deposition enhancement layer (DEL), a radiation source for generating a patterned radiation towards a surface of the DEL, and a supply pipe for flowing an organic gas near the surface of the DEL, wherein elements of the organic gas polymerize upon the patterned radiation, thereby forming a resist pattern over the DEL.

20 Claims, 7 Drawing Sheets

(51) Int. Cl.

| | | |
|---|---|---|
| *G03F 7/16* | (2006.01) | |
| *G03F 7/38* | (2006.01) | |
| *G03F 7/40* | (2006.01) | |
| *B05D 1/00* | (2006.01) | |
| *B05D 3/06* | (2006.01) | |
| *H01L 21/027* | (2006.01) | |
| *H01L 21/311* | (2006.01) | |
| *H01L 21/687* | (2006.01) | |
| *H01L 21/02* | (2006.01) | |
| *G03F 7/004* | (2006.01) | |
| *G03F 7/038* | (2006.01) | |

(52) U.S. Cl.
CPC .. *H01L 21/31133* (2013.01); *H01L 21/31144* (2013.01); *H01L 21/687* (2013.01); *H01L 21/68764* (2013.01)

(56) References Cited

U.S. PATENT DOCUMENTS

| | | | |
|---|---|---|---|
| 5,925,494 | A | 7/1999 | Horn |
| 6,765,647 | B1* | 7/2004 | Nishi ............... G03F 7/70808 250/492.2 |
| 8,105,954 | B2 | 1/2012 | Wang et al. |
| 8,216,767 | B2 | 7/2012 | Wang et al. |
| 8,323,870 | B2 | 12/2012 | Lee et al. |
| 8,580,117 | B2 | 11/2013 | Kao et al. |
| 8,658,344 | B2 | 2/2014 | Wang et al. |
| 8,715,919 | B2 | 5/2014 | Chang et al. |
| 8,741,551 | B2 | 6/2014 | Wu et al. |
| 9,140,987 | B2 | 9/2015 | Chien et al. |
| 9,459,536 | B1 | 10/2016 | Lai et al. |
| 9,632,411 | B2 | 4/2017 | Michaelson et al. |
| 9,659,768 | B2 | 5/2017 | Yu et al. |
| 9,714,463 | B2 | 7/2017 | White et al. |
| 2003/0025889 | A1* | 2/2003 | Hasegawa ............ G03B 27/52 355/30 |
| 2003/0071982 | A1* | 4/2003 | Miyajima ........... G03F 7/70691 355/72 |
| 2005/0248744 | A1* | 11/2005 | Shibazaki .......... G03F 7/70716 355/72 |
| 2006/0146300 | A1* | 7/2006 | Simon ................ G03F 7/70933 355/30 |
| 2010/0099267 | A1 | 4/2010 | Wang et al. |
| 2011/0032496 | A1* | 2/2011 | Shibazaki ............. G03F 7/707 355/30 |
| 2011/0102754 | A1* | 5/2011 | Takagi .................. G03B 27/42 355/53 |
| 2012/0090547 | A1 | 4/2012 | Wang et al. |
| 2013/0323641 | A1 | 12/2013 | Chang |
| 2014/0011133 | A1 | 1/2014 | Liu et al. |
| 2014/0017615 | A1 | 1/2014 | Chang |
| 2014/0017616 | A1 | 1/2014 | Chang |
| 2014/0065843 | A1 | 3/2014 | Chang et al. |
| 2014/0117563 | A1 | 5/2014 | Yu et al. |
| 2014/0120459 | A1 | 5/2014 | Liu et al. |
| 2014/0186773 | A1 | 7/2014 | Chang |
| 2014/0255850 | A1 | 9/2014 | Chang et al. |
| 2014/0272709 | A1 | 9/2014 | Liu et al. |
| 2014/0272726 | A1 | 9/2014 | Chang |
| 2014/0273521 | A1 | 9/2014 | Wu et al. |
| 2015/0064838 | A1 | 3/2015 | Logue et al. |
| 2016/0097125 | A1 | 4/2016 | Tavares et al. |
| 2017/0068174 | A1 | 3/2017 | Michaelson et al. |

* cited by examiner

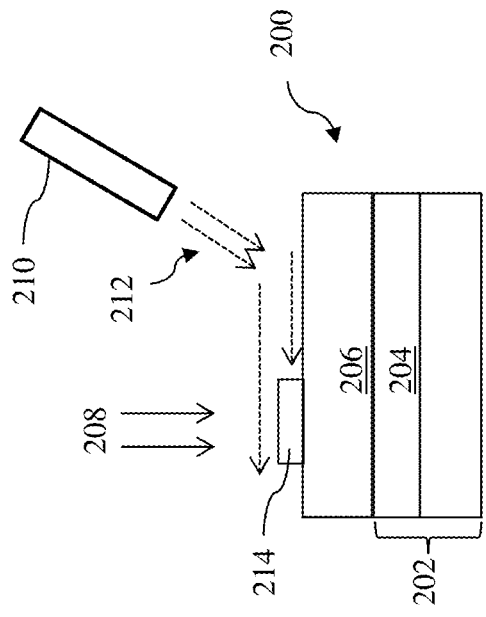
FIG. 2C
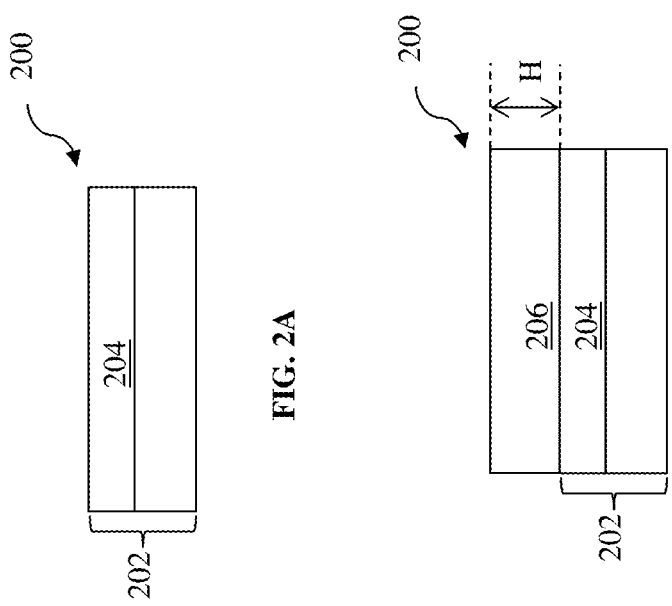
FIG. 2A
FIG. 2B

LITHOGRAPHY PATTERNING WITH A GAS PHASE RESIST

PRIORITY

This is a divisional of U.S. patent application Ser. No. 15/061,860, filed Mar. 4, 2016, herein incorporated by reference in its entirety.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have arisen. For example, the need to perform higher resolution lithography patterning grows.

Techniques such as extreme ultraviolet (EUV) lithography have been utilized to support high resolution requirements of nano-scale semiconductor devices. EUV lithography employs radiations in the EUV region, having a wavelength of about 1-100 nm, thereby providing finer resolution than traditional radiation sources such as KrF and ArF. However, realizing all the benefits that EUV lithography can offer remains challenging. One challenge is in the resist materials and the resist patterning processes used for EUV lithography.

A commonly used resist material for lithography is a chemically amplified resist (CAR) that contains backbone polymer protected by acid labile groups (ALGs). CAR further contains photo-acid generators which, upon radiation, produce an acid. The acid can catalyze the cleaving of the ALGs from the backbone polymer, such as in a post exposure bake process. The de-protected portion of the resist is dissolved in a liquid developer, leaving the remaining portion of the resist as a resist pattern. Issues may arise during the exposure and development of the resist. For example, diffusion of the acid during the exposure may lead to blurring of the edges of the patterned areas, thus limiting the resolution and line edge roughness (LER) of the resist pattern. For example, when the exposed resist is developed in a liquid developer, the resist pattern may collapse due to its high aspect ratio and the developer's surface tension.

Accordingly, a new resist and the associated patterning processes are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, and 2E illustrate cross sectional views of forming a target pattern according to the method of FIG. 1, in accordance with an embodiment.

DETAILED DESCRIPTION

Figure 1:
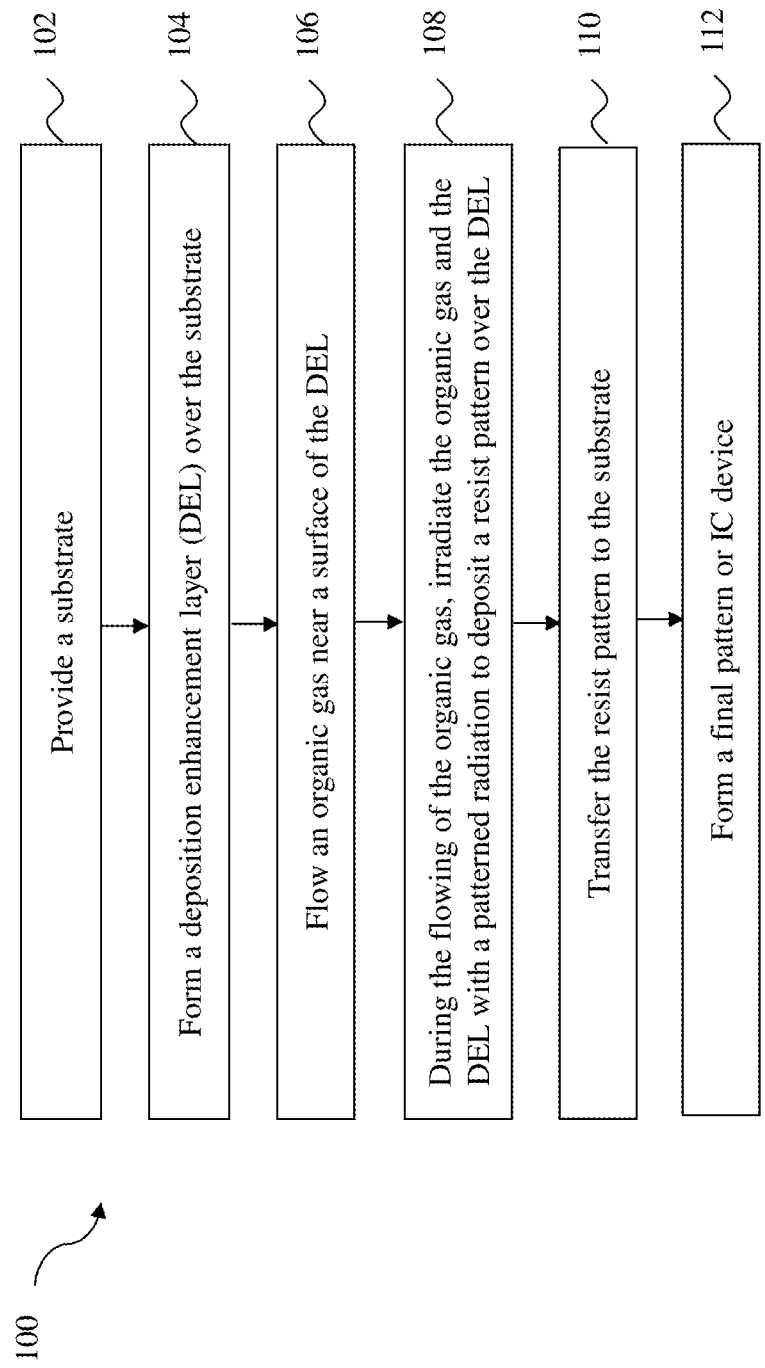
FIG. 1 illustrates a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to lithography patterning with a novel resist. According to aspects of the present disclosure, the novel resist comprises an organic gas. Thus, it is a gas phase resist. The novel resist is flowed, or otherwise supplied, to a patterning surface. In contrast, traditional resist materials are liquids and are typically spin-coated onto a patterning surface. According to aspects of the present disclosure, the gas phase resist is irradiated with a patterned radiation, such as a patterned EUV radiation or a patterned electron beam (e-beam). Elements of the gas phase resist polymerize upon the radiation, thereby depositing a resist pattern over the patterning surface. According to embodiments of the present disclosure, the resist pattern is deposited without such acid diffusion as in the case of CAR and does not undergo a developing process by a liquid developer. Therefore, the resist pattern has higher resolution and lower LER than traditional resist patterns, and does not suffer from the pattern collapsing issues associated with the traditional resist patterns. The resist pattern is then used as an etch mask in subsequent etching processes, transferring the pattern to underlying patterning layers. The novel gas phase resist and the associated patterning processes are well-suited for advanced lithography processes including EUV lithography and e-beam lithography.

FIG. 1 is a flow chart of a method 100 of patterning a substrate (e.g., a semiconductor wafer) according to various aspects of the present disclosure. The method 100 may be implemented, in whole or in part, by a system employing EUV lithography, e-beam lithography, and other advanced lithography processes to improve pattern dimension accuracy. In the present embodiment, EUV lithography is used as the primary example. Additional operations can be provided before, during, and after the method 100, and some operations described can be replaced, eliminated, or relocated for additional embodiments of the method. The method 100 is an example, and is not intended to limit the present disclosure beyond what is explicitly recited in the claims. The method 100 is described below in conjunction with FIGS. 2A-2E wherein a semiconductor device 200 is fabricated by using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other multi-gate FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 (FIG. 1) is provided with a substrate 202 (FIG. 2A) at operation 102. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In the present embodiment, the substrate 202 includes a patterning layer 204. In an embodiment, the patterning layer 204 is a hard mask layer including material(s) such as amorphous silicon (a-Si), silicon oxide, silicon nitride (SiN), titanium nitride, or other suitable materials or compositions. In various embodiments, the patterning layer 204 may include a dielectric layer such as a high-k dielectric layer, a gate layer, a hard mask layer, an interfacial layer, a capping layer, a diffusion barrier layer, a conductive layer, other suitable layers, and/or combinations thereof.

In another embodiment, the substrate 202 is a mask substrate that may include a low thermal expansion material such as quartz, silicon, silicon carbide, or silicon oxide-titanium oxide compound. To further this example, the substrate 202 may be a mask substrate for making a deep ultraviolet (DUV) mask, an extreme ultraviolet (EUV) mask, or other types of masks.

The method 100 (FIG. 1) proceeds to operations 104 by forming a material layer 206 over the substrate 202 (FIG. 2B). In the present embodiment, the material layer 206 is used for enhancing the deposition of the novel gas phase resist constructed according to the present disclosure. Therefore, the material layer 206 is also referred to as the deposition enhancement layer (DEL) 206. In some embodiments, the rate of the resist pattern deposition depends on both the material of the gas phase resist and the material of the DEL 206. In embodiments, the DEL 206 has high absorption of a EUV radiation and is capable of generating secondary electrons when irradiated by the EUV radiation. The secondary electrons promote polymerization of the gas phase resist.

In an embodiment, the DEL 206 comprises Ruthenium (Ru), such as a layer of the metal Ru. The inventors of the present disclosure have observed high deposition rate (or growth rate) of resist patterns over the DEL 206 comprising Ru. In alternative embodiments, the DEL 206 may comprise an oxide of the metal Ru or a metal complex having Ru atoms. Alternatively or additionally, the DEL 206 may comprise a metal such as Ce, La, Sb, Pb, Hf, Zr, Ti, Cr, W, Mo, Fe, Os, Co, Rh, Ir, Ni, Pd, Pt, Cu, Ag, Au, Zn, Cd, Al, Ga, Tl, Ge, Sn, and Bi. For example, the DEL 206 may comprise a layer of the metal, an oxide of the metal, or a metal complex having atoms of the metal.

In an embodiment, the DEL 206 comprises a polymer having a functional group selected from a group consisting of: —I, —Br, and —Cl. In another embodiment, the DEL 206 comprises a polymer having a functional group selected from a group consisting of: —$NH_2$, —COOH, —OH, —SH, —$N_3$, and —S(=O)—. In yet another embodiment, the DEL 206 comprises a polymer having a functional group selected from a group consisting of: alkene, alkyne, imine, ether, vinyl ether, acetal, hemiacetal, ester, aldehyde, ketone, amide, sulfone, acetic acid, cyanide, and allene. In each of the above embodiments, the polymer may have a non-cyclic structure or a cyclic structure, and the cyclic structure can be an aromatic ring or a non-aromatic ring.

In embodiments, a thickness "H" of the DEL 206 may be selected based on its intended use. In an embodiment, the DEL 206 is used primarily for depositing a resist pattern thereon, while the resist pattern is used as a primary etch mask for etching the substrate 202. To further this embodiment, the DEL 206 may be deposited as a relatively thin layer (e.g., "H" is 10 nanometers (nm) or less) so long as it sufficiently generates secondary electrons. In another embodiment, the DEL 206 is used not only for depositing a resist pattern thereon, but also as an etch mask for etching the substrate 202. To further this embodiment, the DEL 206 may be deposited as a relatively thick layer (e.g., "H" ranges from 30 nm to 50 nm) for the purpose of being an etch mask.

In some embodiments, the DEL 206 may be formed over the substrate 202 using chemical vapor deposition (CVD), plasma enhanced CVD, physical vapor deposition (PVD), atomic layer deposition (ALD), spin-coating, plating, or other suitable deposition techniques, depending on the material(s) selected for the DEL 206.

The method 100 (FIG. 1) proceeds to operation 106 by flowing or supplying an organic gas 212 near a top surface of the DEL 206 (FIG. 2C). Referring FIG. 2C, in the present embodiment, the organic gas 212 flows through a supply pipe 210 which is configured to control the flow rate and the flow direction of the organic gas 212. Elements of the organic gas 212 adsorb to the surface of the DEL 206 and further spread out in an area near the vicinity of the point of supply.

While the organic gas 212 is being supplied to the surface of the DEL 206, the method 100 (FIG. 1) proceeds to operation 108 to irradiate the organic gas 212 and the DEL 206 with a patterned radiation (or a patterned radiation beam) 208 (FIG. 2C). Referring FIG. 2C, the patterned radiation 208, the organic gas 212, and the DEL 206 collectively deposit a resist pattern 214 over the DEL 206. The mechanism of the deposition may be explained as follows. In an embodiment, the radiation 208 is a highly energetic radiation such as a EUV ray or an e-beam. The DEL 206 absorbs some of the energy of the radiation 208, thereby generating secondary electrons. Meanwhile, the organic gas 212 undergoes polymerization reaction after being exposed to the radiation 208. The polymerization reaction may be promoted and enhanced by the secondary electrons released from the DEL 206. The polymerization reaction leads to the deposition of the resist pattern 214. Furthermore, the radiation 208 is patterned with a pattern of an IC design layout, for example, through the use of a EUV mask or of a maskless patterning process. Thus, only certain areas of the surface of the DEL 206 are irradiated by the radiation 208 and, in these areas, so deposited the resist pattern 214.

In embodiments, the organic gas 212 comprises reactive sites or cross-linkable groups that make polymerization possible. Some elements of the organic gas 212 may be photo-sensitive. For example, they may absorb the radiation 208 and generate secondary electrons. In an embodiment, the organic gas 212 comprises an organic molecule having one or more cross-linkable groups. For example, the cross-linkable groups may include a $C_3$-$C_{20}$ alkyl group (an alkyl group having three to twenty carbon atoms) having at least one light-sensitive functional group. In a further embodiment, the light-sensitive functional group is selected from a group consisting of: epoxy, azo compounds, alkyl halide, imine, alkene, alkyne, peroxide, ketone, aldehyde, allene, aromatic groups, and heterocyclic groups. Furthermore, the aromatic groups may comprise phenyl, napthlenyl, phenanthrenyl, anthracenyl, phenalynyl, and other aromatic derivatives having one to five-membered rings.

In an embodiment, the organic gas 212 comprises an organic molecule that has a functional group selected from a group consisting of: —I, —Br, and —Cl. In another embodiment, the organic gas 212 comprises an organic molecule that has a functional group selected from a group consisting of: —$NH_2$, —COOH, —OH, —SH, —$N_3$, and —S(═O)—. In yet another embodiment, the organic gas 212 comprises an organic molecule that has a functional group selected from a group consisting of: alkene, alkyne, imine, ether, vinyl ether, acetal, hemiacetal, ester, aldehyde, ketone, amide, sulfone, acetic acid, cyanide, and allene. The chemical structure of the molecules of the organic gas 212 can be cyclic or non-cyclic. The cyclic structure can be an aromatic ring or a non-aromatic ring.

In another embodiment, the organic gas 212 comprises a metal complex wherein metal atoms of the metal complex may be selected from a group consisting of Ce, La, Sb, Bi, Pb, Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, and Sn. To further this embodiment, a ligand of the metal complex has a functional group selected from a group consisting of: —I, —Br, and —Cl. In an alternative embodiment, the ligand of the metal complex has a functional group selected from a group consisting of: —$NH_2$, —COOH, —OH, —SH, —$N_3$, and —S(═O)—. In yet another alternative embodiment, the ligand of the metal complex has a functional group selected from a group consisting of: alkene, alkyne, imine, ether, vinyl ether, acetal, hemiacetal, ester, aldehyde, ketone, amide, sulfone, acetic acid, cyanide, and allene.

In various embodiments, the molecular weight of the organic gas 212 may range from 30 to 10,000 g/mol. In embodiments, the flow rate of the organic gas 212 is selected to facilitate volume production. For example, the flow rate of the organic gas 212 may be selected in a range from 10,000 to 100,000 standard cubic centimeters per minute (sccm). In various embodiments, the flow rate of the organic gas 212 may range from 10 to 100,000 sccm. The inventors of the present disclosure have observed that a higher pressure of the organic gas 212 in the deposition environment generally leads to faster deposition of the resist pattern 214, and that a higher flow rate of the organic gas 212 generally leads to a higher pressure thereof.

As discussed above, the formation of the resist pattern 214 does not undergo an acid diffusion process associated with traditional CAR-based resist patterns. Therefore, it provides finer resolution and smoother edges and sidewalls than the traditional CAR-based resist patterns. Furthermore, the resist pattern 214 is directly deposited over the substrate 202 without being developed by an aqueous developer, thereby reducing the likelihood of pattern collapsing issues seen with the traditional CAR-based resist patterns.

Figure 2E:
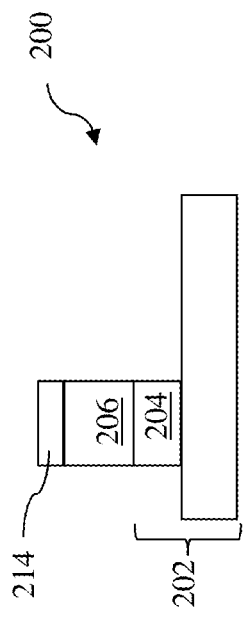
Figure 2D:
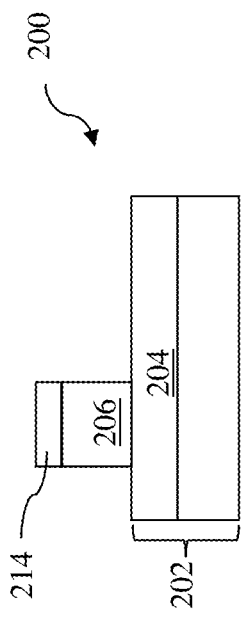

The method 100 (FIG. 1) proceeds to operation 110 to transfer the pattern from the resist pattern 214 to the substrate 202. In an embodiment, operation 110 includes etching the DEL 206 with the resist pattern 214 as an etch mask, thereby forming a patterned DEL 206 (FIG. 2D). The resist pattern 214 may be partially consumed during this operation. Thereafter, operation 110 further includes etching the substrate 202 with the patterned DEL 206, and possibly the resist pattern 214 as well, as an etch mask (FIG. 2E). In another embodiment, operation 110 includes etching both the DEL 206 and the substrate 202 using the resist pattern 214 as an etch mask.

As a result of the operation 110, the pattern is transferred from the resist pattern 214 to the patterning layer 204 of the substrate 202 (FIG. 2E). The etching of the DEL 206 and the substrate 202 may use a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The resist pattern 214 may be partially or completely consumed during the etching of the DEL 206 and the patterning layer 204.

The method 100 (FIG. 1) proceeds to operation 112 to form a final pattern or an IC device on the substrate 202. In an embodiment, the substrate 202 is a semiconductor substrate and the method 100 proceeds to forming fin field effect transistor (FinFET) structures. In this embodiment, operation 112 forms a plurality of active fins in the semiconductor substrate 202. The active fins have uniform width and length due to the smooth edges and sidewalls of the resist pattern 214. In another embodiment, the method 100 proceeds to forming a plurality of gate electrodes in the semiconductor substrate 202. The gate electrodes have uniform gate length due to the quality of the resist pattern 214. The method 100 may further form gate spacers, source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 202, which has been etched by operation 110 to include a plurality of trenches. The method 100 proceeds to filling the trenches with a conductive material, such as a metal; and polishing the conductive material using a process such as chemical mechanical planarization (CMP) to expose the patterned ILD layer, thereby forming the metal lines in the ILD layer. The above are non-limiting examples of devices/structures that can be made and/or improved using the method 100 according to various aspects of the present disclosure.

Figure 3:
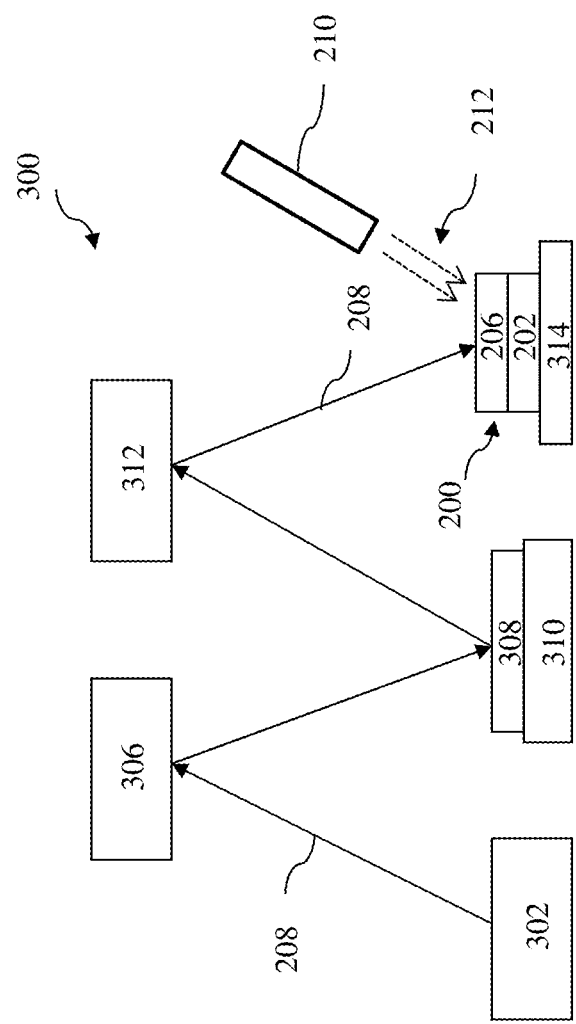
FIGS. 3, 4A, 4B, and 4C illustrate apparatuses that may be utilized by the method of FIG. 1, in accordance with some embodiments.

FIG. 3 is a schematic view of a EUV lithography system 300, according to aspects of the present disclosure. The EUV lithography system 300 may be used for performing some operations of the method 100, such as the operations 106 and 108. Referring to FIG. 3, the EUV lithography system 300 includes a radiation source 302 that produces the radiation 208, condenser optics 306, a mask stage 310 securing a EUV mask 308 thereon, projection optics 312, and a substrate stage 314 securing the device 200 including the substrate 202 and the DEL 206. The EUV lithography system 300 further includes the supply pipe 210 for supplying the organic gas 212 near a top surface of the DEL 206. Other configurations and inclusion or omission of items may be possible. In the present disclosure, the EUV lithography system 300 may be a stepper or a scanner. The various components of the EUV lithography system 300 are briefly described below.

The radiation source 302 provides the radiation 208 having a wavelength in the EUV range, such as about 1-100 nm. In one example, the radiation 208 has a wavelength of about 13.5 nm. In embodiments, the radiation source 302 may use laser produced plasma (LPP) to generate the radiation 208. The condenser optics 306 includes a multi-layer coated collector and a plurality of grazing mirrors. The condenser optics 306 is configured to collect and shape the radiation 208 and to provide a slit of the radiation 208 to the mask 308. The mask 308, also referred to as a photomask or a reticle, includes patterns of one or more target IC devices. The mask 308 provides a patterned aerial image to the radiation 208, which then becomes a patterned radiation 208. The mask 308 is a reflective mask in the present embodiment, and may incorporate resolution enhancement techniques such as phase-shifting techniques and/or optical proximity correction. The mask stage 310 secures the mask 308 thereon, such as by vacuum, and provides accurate position and movement of the mask 308 during alignment, focus, leveling, and deposition operation in the EUV lithography system 300.

The projection optics 312 includes one or more lens and a plurality of mirrors. The lens may have a magnification of less than one thereby reducing the patterned aerial image of the mask 308 to the device 200, particularly, to the DEL 206. The device 200 is secured by the substrate stage 314 which provides accurate position and movement of the device 200 during alignment, focus, leveling, and deposition operation in the EUV lithography system 300 such that the patterned aerial image of the mask 308 is irradiated onto the DEL 206. The substrate stage 314 can further move the device 200 relative to the supply pipe 210 and the patterned radiation 208 so that the resist pattern 214 is deposited (or grown) across an area of the DEL 206.

Figure 4B:
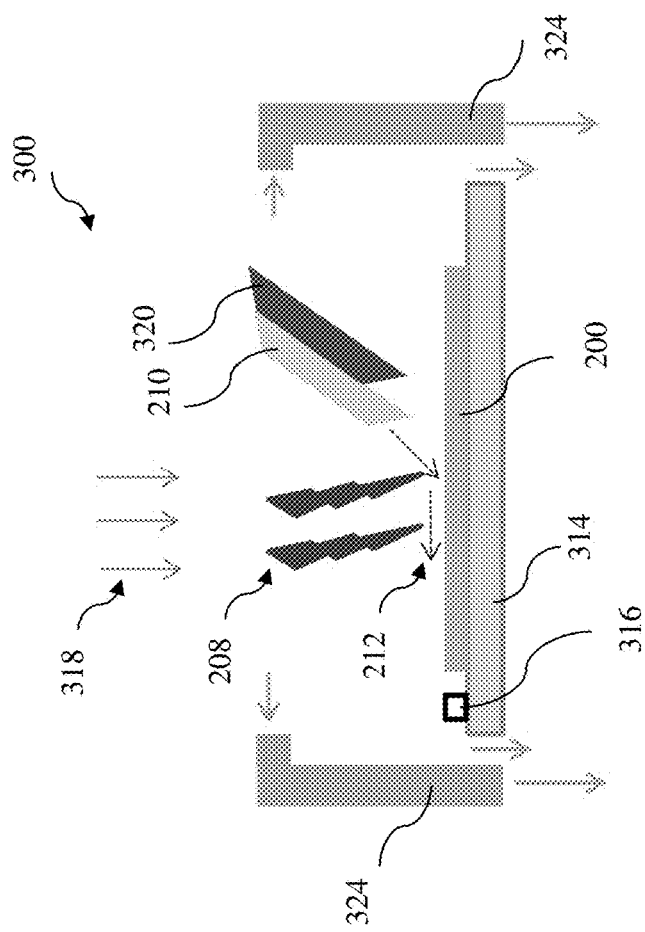
Figure 4A:
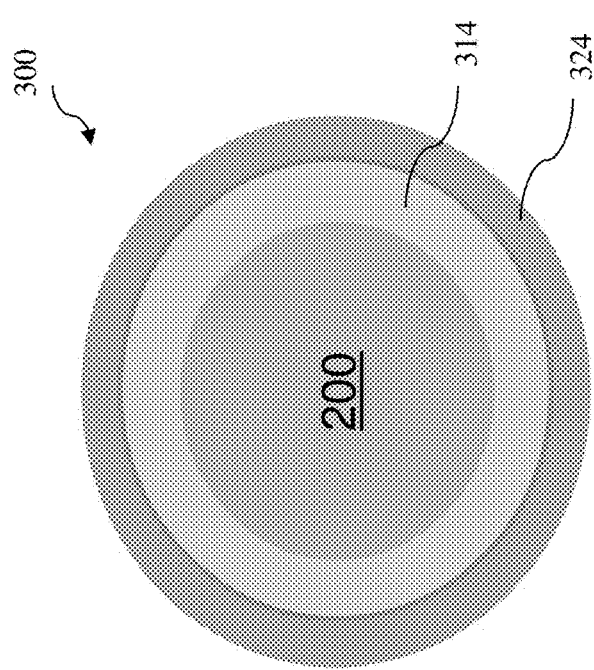
Figure 4C:
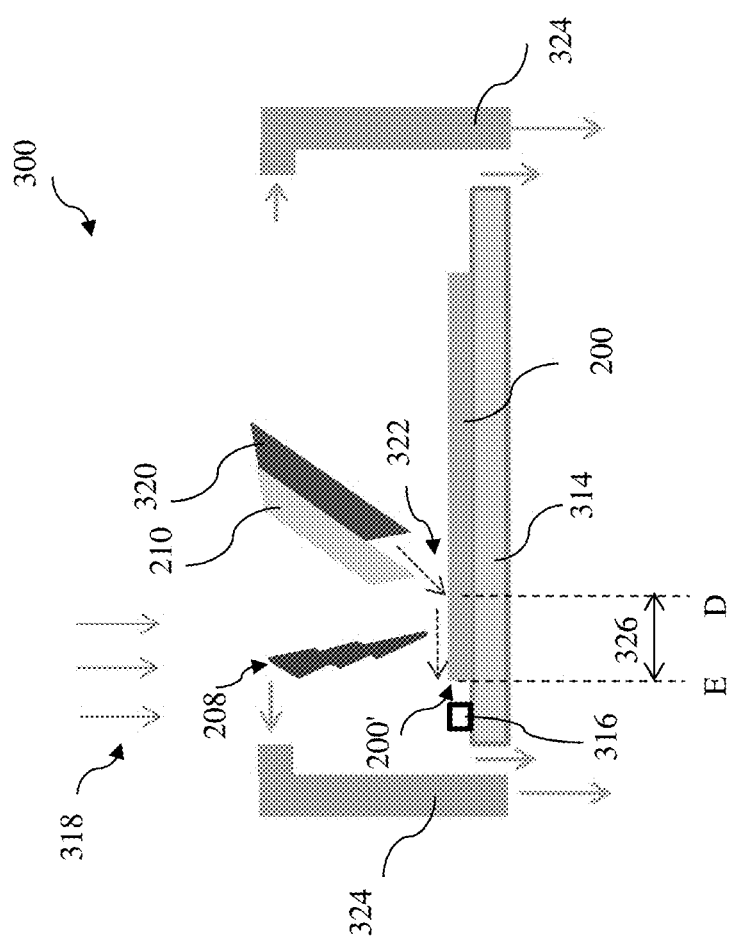

FIGS. 4A, 4B, and 4C further illustrate some components of the EUV lithography system 300 and the movements thereof in depositing the resist pattern 214 across a top surface of the device 200. FIG. 4A shows a top view of the EUV lithography system 300, in portion, while FIGS. 4B and 4C illustrate side views of the EUV lithography system 300.

Referring to FIGS. 4A, 4B, and 4C collectively, the EUV lithography system 300 includes a slit sensor 316 for monitoring the energy level of the radiation beam 208. In this embodiment, the slit sensor 316 is integrated with the substrate stage 314 at a place near an edge of the device 200 (e.g., a wafer). The EUV lithography system 300 further includes a mechanism for supplying a gas flow 318 which is hydrogen gas in the present embodiment. Hydrogen gas has less absorption to the EUV radiation 208 and can be used for reducing contamination of the various components of the EUV lithography system 300 (FIG. 3) by the byproducts of the polymerization reaction. The EUV lithography system 300 further includes a supply pipe 320 which is to flow a gas 322 (FIG. 4C) to the surface of the DEL 206. In this embodiment, the gas 322 is hydrogen gas. In the present embodiment, the supply pipe 320 is configured to work in conjunction with the supply pipe 210 and the patterned radiation 208 to reduce contamination of the slit sensor 316, as explained in the next paragraph. Also shown in FIGS. 4A-4C, the EUV lithography system 300 further includes an exhaust line 324 for discharging the gaseous waste and/or contaminants out of the EUV lithography system 300. In the present embodiment, the exhaust line 324 is configured around the substrate stage 314, and the contaminants are discharged through the exhaust line 324 and through the gap between the exhaust line 324 and the substrate stage 314.

As shown in FIG. 4B, the patterned radiation 208 irradiates an area of the device 200 (having the DEL 206 as its top layer), for example, at or near the center of the device 200. At the same time, the supply pipe 210 flows the organic gas 212 towards the vicinity of the same area. As discussed above, the resist pattern 214 (FIG. 2C) is thereby deposited in the irradiated area as a result of the polymerization reaction. The supply pipe 320 is shut off at this time, i.e., it does not supply the gas 322 to the surface of the device 200.

In the present embodiment, the device 200 is moved relative to the radiation 208 and the supply pipes 210 and 320 such that the resist pattern 214 is deposited across an area of the device 200 according to the IC pattern to be transferred. The movement of the device 200 may be carried out by the substrate stage 314.

Referring to FIG. 4C, when the resist pattern 214 is deposited near an edge of the device 200 (shown in FIG. 4C as point D which is a distance 326 away from the edge E of the device 200), the supply pipe 210 is shut off and the supply pipe 320 is turned on. The gas 322 (e.g., hydrogen gas) flows to the surface of the device 200 to purge it of any organic gas residues. As a result, the resist pattern 214 is not deposited in the area between D and E, including at the edge E. Subsequently, when the radiation 208 is at or near the slit sensor 316, there is no organic gas 212 or only insignificant amount of organic gas 212 present in the vicinity of the slit sensor 316. This advantageously prevents the slit sensor 316 from being contaminated by the organic gas 212 or its derivatives.

Figure 5:
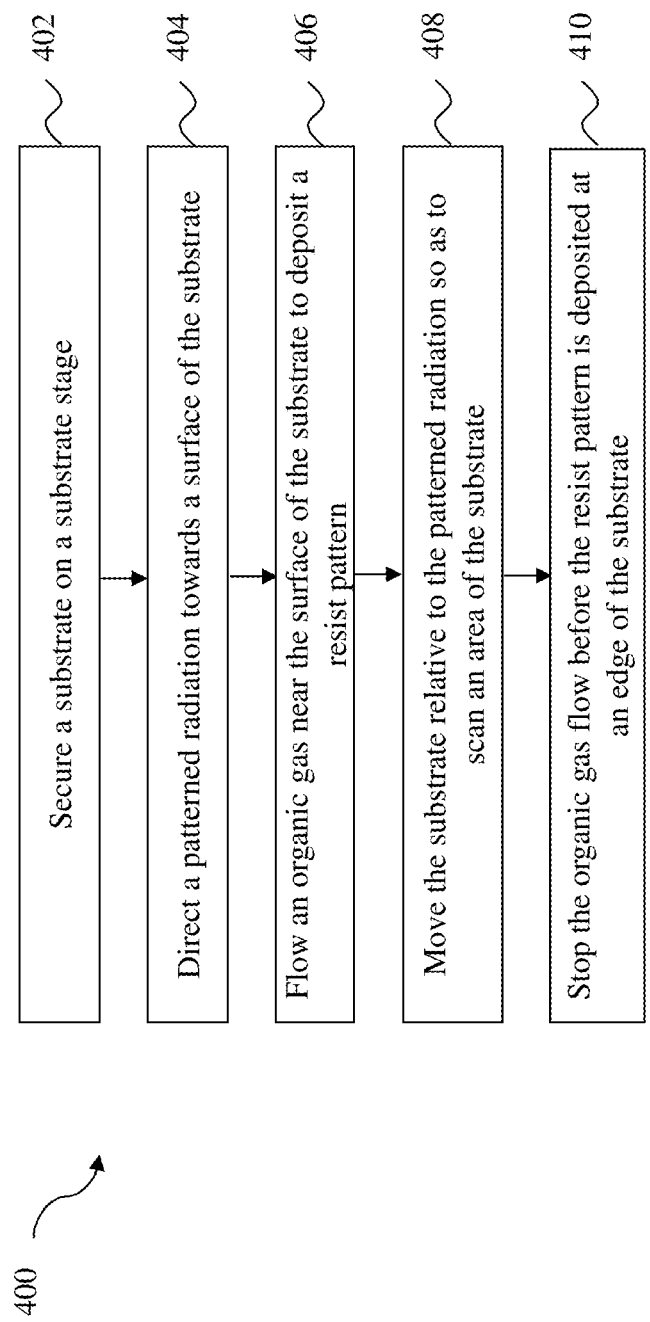
FIG. 5 illustrates a flow chart of another lithography patterning method according to various aspects of the present disclosure.

FIG. 5 shows a method 400 for lithography patterning using a lithography system, such as the EUV lithography system 300. The method 400 is briefly discussed below using the EUV lithography system 300 as the exemplary system.

At operation 402, the method 400 secures a substrate 200 (e.g., a wafer) on a substrate stage 314 (e.g., FIG. 4A). In the present embodiment, the substrate 200 has a DEL 206 as its top layer. At operation 404, the method 400 directs a patterned radiation 208 towards a surface of the substrate 200 (e.g., FIG. 4B). At operation 406, the method 400 flows an organic gas 212 near the surface of the substrate 200 (e.g., FIG. 4B). As a result, a resist pattern 214 (e.g., FIG. 2C), is deposited over the substrate 200. At operation 408, the method 400 moves the substrate 200 relative to the patterned radiation 208 so as to scan an area of the substrate. The movement is driven by the substrate stage 314. In an embodiment, the organic gas flow 212 is supplied through a supply pipe whose position may be fixed relative to the patterned radiation 208. At operation 410, the method 400 stops the organic gas flow before the resist pattern 214 is deposited at an edge of the substrate 200. In an embodiment, the method 400 further includes flowing hydrogen gas to the surface of the substrate when the organic gas flow is stopped.

Advantageously, the method 400 controls where the resist pattern 214 is to be formed or deposited. In contrast, traditional CAR-based resist is spin-coated onto the entire surface of the substrate 200. Sometimes thickness of such spin-coated resist layer is not uniform across the surface, especially between the center and the edge of the substrate 200. The non-uniform thickness may lead to patterning issues, such as over-exposure, under-exposure, over-development, and/or under-development. In the present embodiment, the method 400 overcomes such issues because, among other factors, the resist pattern 214 is only formed where it is desired, such as away from the edges, and the resist pattern 214 is directly deposited and does not undergo a developing process.

Although not intended to be limiting, one or more embodiments of the present disclosure provide many benefits to a semiconductor device and the formation thereof. For example, a resist pattern formed according to the present disclosure provides smooth edges and sidewalls with near uniform critical dimensions, which is highly desirable for advanced lithography, such as EUV lithography or e-beam lithography. Embodiments of the present disclosure enable the deposition of a resist pattern in selected areas of a substrate, thereby reducing the costs associated with resist material and resist developing processes.

In one exemplary aspect, the present disclosure is directed to a method for lithography patterning. The method includes providing a substrate, forming a deposition enhancement layer (DEL) over the substrate, and flowing an organic gas near a surface of the DEL. During the flowing of the organic gas, the method further includes irradiating the DEL and the organic gas with a patterned radiation. Elements of the organic gas polymerize upon the patterned radiation, thereby forming a resist pattern over the DEL. The method further includes etching the DEL with the resist pattern as an etch mask, thereby forming a patterned DEL. In an embodiment, the method further includes etching the substrate with at least one of the patterned DEL and the resist pattern as an etch mask.

In another exemplary aspect, the present disclosure is directed to an apparatus for lithography patterning. The apparatus includes a mechanism for producing a patterned radiation beam, a substrate stage configured to hold a substrate, a first supply pipe for flowing an organic gas near a surface of the substrate, and a second supply pipe for flowing hydrogen gas near the surface of the substrate. The first supply pipe is configured to flow the organic gas while the patterned radiation beam scans the surface of the substrate and to shut off the flowing of the organic gas before the patterned radiation beam reaches an edge of the substrate. The second supply pipe is configured to flow the hydrogen gas when the first supply pipe is shut off and to shut off the flowing of the hydrogen gas when the first supply pipe flows the organic gas. In an embodiment, the patterned radiation beam causes the organic gas to polymerize, thereby depositing a resist pattern over the substrate.

In another exemplary aspect, the present disclosure is directed to a method for lithography patterning. The method includes directing a patterned radiation towards a surface of a substrate and supplying an organic gas near the surface of the substrate. Elements of the organic gas polymerize upon the patterned radiation, thereby forming a resist pattern over the surface of the substrate. The method further includes moving the substrate relative to the patterned radiation such that the resist pattern is formed across an area of the substrate. The method further includes stopping the supplying of the organic gas when the resist pattern is formed near an edge of the substrate. In an embodiment, the method further includes flowing hydrogen gas after the stopping of the supplying of the organic gas.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a substrate stage configured to hold a substrate coated with a deposition enhancement layer (DEL);
   a radiation source for generating a patterned radiation towards a surface of the DEL; and
   a supply pipe for flowing an organic gas near the surface of the DEL, wherein elements of the organic gas polymerize upon the patterned radiation, thereby forming a resist pattern over the DEL, and wherein the supply pipe is configured to flow the organic gas while the patterned radiation scans the surface of the DEL and to shut off the flowing of the organic gas before the patterned radiation reaches an edge of the DEL.

2. The apparatus of claim 1, further comprising:
   a flushing pipe for flowing a flushing gas that is insensitive to the patterned radiation.

3. The apparatus of claim 2, wherein the flushing pipe is configured to flow the flushing gas when the supply pipe is shut off and to shut off the flowing of the flushing gas when the supply pipe flows the organic gas.

4. The apparatus of claim 2, wherein the supply pipe and the flushing pipe both extend lengthwise in the same direction.

5. The apparatus of claim 2, wherein the supply pipe is abut to the flushing pipe.

6. The apparatus of claim 1, wherein the substrate stage is configured to move the substrate and the DEL relative to the patterned radiation such that the patterned radiation scans the surface of the DEL.

7. The apparatus of claim 1, further comprising:
   a slit sensor configured to monitor an energy level of the patterned radiation.

8. The apparatus of claim 7, wherein the slit sensor is integrated with the substrate stage.

9. The apparatus of claim 1, further comprising:
   an exhaust line configured to discharge gaseous wastes.

10. The apparatus of claim 9, wherein the exhaust line surrounds the substrate stage.

11. The apparatus of claim 1, wherein the radiation source is an extreme ultraviolet (EUV) radiation source.

12. The apparatus of claim 1, wherein the supply pipe is operable to flow the organic gas at a flow rate ranging from about 10,000 sccm to about 100,000 sccm.

13. An apparatus, comprising:
a mechanism for producing a patterned radiation beam;
a substrate stage configured to hold a substrate;
a first supply pipe for flowing an organic gas near a surface of the substrate; and
a second supply pipe for flowing hydrogen gas near the surface of the substrate,
wherein:
the first supply pipe is configured to flow the organic gas while the patterned radiation beam scans the surface of the substrate and to shut off the flowing of the organic gas before the patterned radiation beam reaches an edge of the substrate; and
the second supply pipe is configured to flow the hydrogen gas when the first supply pipe is shut off and to shut off the flowing of the hydrogen gas when the first supply pipe flows the organic gas.

14. The apparatus of claim 13, wherein the first supply pipe extends in a first direction, the second supply pipe extends in a second direction, and the first direction is parallel to the second direction.

15. The apparatus of claim 13, wherein the first supply pipe is abut to the second supply pipe.

16. The apparatus of claim 13, further comprising:
an exhaust mechanism configured to discharge gaseous wastes.

17. The apparatus of claim 16, wherein the exhaust mechanism surrounds the substrate stage.

18. An apparatus for extreme ultraviolet (EUV) lithography, comprising:
an EUV radiation source operable to direct a patterned radiation towards a surface of a deposition enhancement layer (DEL) over a substrate;
a substrate stage for holding the substrate;
a slit sensor for monitoring an energy level of the patterned radiation;
a supply pipe for flowing an organic gas near the surface of the DEL;
a flushing mechanism for flowing a flushing gas; and
an exhaust mechanism for discharge gaseous wastes during the EUV lithography.

19. The apparatus of claim 18, wherein the substrate stage is operable to move the substrate and the DEL relative to the patterned radiation such that the patterned radiation scans the surface of the DEL.

20. The apparatus of claim 19, wherein the flushing mechanism is operable to shut off the flowing of the flushing gas before the patterned radiation reaches an edge of the DEL.

* * * * *